United States Patent
Hämäläinen

(10) Patent No.: US 6,954,624 B2
(45) Date of Patent: Oct. 11, 2005

(54) TRANSMITTER AND WIRELESS COMMUNICATION DEVICE HAVING A LOW POWER BYPASS BRANCH

(75) Inventor: Miikka Hämäläinen, Espoo (FI)

(73) Assignee: Nokia Mobile Phones Ltd., Espoo (FI)

( * ) Notice: Subject to any disclaimer, the term of this patent is extended or adjusted under 35 U.S.C. 154(b) by 659 days.

(21) Appl. No.: 09/950,381

(22) Filed: Sep. 10, 2001

(65) Prior Publication Data

US 2002/0072339 A1 Jun. 13, 2002

(30) Foreign Application Priority Data

Sep. 12, 2000 (FI) .............................................. 20002007

(51) Int. Cl.$^7$ .............................. H04B 1/06; H04B 7/00
(52) U.S. Cl. ................................ 455/241.1; 455/127.3; 455/136; 455/232.1; 455/253.2
(58) Field of Search .............................. 455/114.3, 117, 455/127.1–127.5, 132–138, 140, 143, 144, 191.1, 232.1, 240.1, 241.1, 253.2, 341, 553.1, 572; 330/88–89, 151, 310, 311, 278, 295

(56) References Cited

U.S. PATENT DOCUMENTS

| | | | | |
|---|---|---|---|---|
| 4,667,167 A | * | 5/1987 | Kupfer | 330/281 |
| 4,910,478 A | * | 3/1990 | Koyama | 330/278 |
| 5,152,004 A | * | 9/1992 | Vaisanen et al. | 455/68 |
| 5,175,871 A | * | 12/1992 | Kunkel | 455/69 |
| 5,291,516 A | * | 3/1994 | Dixon et al. | 375/131 |
| 5,530,923 A | * | 6/1996 | Heinonen et al. | 455/126 |
| 5,590,419 A | * | 12/1996 | Shimo | 455/127.2 |
| 5,661,434 A | * | 8/1997 | Brozovich et al. | 330/51 |
| 5,722,063 A | * | 2/1998 | Peterzell et al. | 455/287 |
| 5,757,858 A | * | 5/1998 | Black et al. | 375/295 |
| 5,758,269 A | * | 5/1998 | Wu | 455/127.3 |
| 5,774,017 A | * | 6/1998 | Adar | 330/51 |
| 5,796,772 A | * | 8/1998 | Smith et al. | 375/130 |
| 5,815,525 A | * | 9/1998 | Smith et al. | 375/130 |
| 5,815,801 A | * | 9/1998 | Hamalainen et al. | 455/63.1 |
| 5,878,087 A | * | 3/1999 | Ichihara | 375/316 |
| 5,881,365 A | * | 3/1999 | Yang et al. | 455/45 |
| 5,884,149 A | * | 3/1999 | Jaakola | 455/103 |
| 5,887,020 A | * | 3/1999 | Smith et al. | 375/130 |
| 5,909,643 A | * | 6/1999 | Aihara | 455/127.3 |
| 6,038,428 A | * | 3/2000 | Mizusawa et al. | 455/69 |
| 6,069,526 A | * | 5/2000 | Ballantyne | 330/51 |
| 6,091,966 A | * | 7/2000 | Meadows | 455/553.1 |
| 6,118,989 A | * | 9/2000 | Abe et al. | 455/127.2 |
| 6,134,427 A | * | 10/2000 | Hughes | 455/269 |
| 6,137,354 A | * | 10/2000 | Dacus et al. | 330/51 |

(Continued)

FOREIGN PATENT DOCUMENTS

| | | |
|---|---|---|
| EP | 0 397 445 | 11/1990 |
| EP | 0 675 605 | 10/1995 |
| EP | 0 961 402 | 12/1999 |
| JP | 2000201090 | 7/2000 |

*Primary Examiner*—Roland G. Foster
(74) *Attorney, Agent, or Firm*—Perman & Green, LLP

(57) ABSTRACT

A transmitter into which a modulated signal (TX) is fed, the transmitter comprising an adjustable amplifier (1) for adjusting transmission power level, the modulated signal (TX) being fed into to the input of the amplifier (1), an amplification branch (11) arranged after the adjustable amplifier (1) on the signal path, the amplification branch comprising a power amplifier (3) for further amplifying the transmission power level, and at least one filter (27, 28) arranged after the power amplifier (3) on the signal path for filtering the frequency band to be transmitted. The transmitter further comprises an antenna (9) after the amplification branch (11) on the signal path for transmitting signals. The transmitted is characterized by a bypass branch (10) which operatively couples the output of the adjustable amplifier (1) and the antenna (9) and is used for bypassing the amplification branch (11) and connecting signals to be transmitted at low transmission power levels directly to the antenna (9).

6 Claims, 3 Drawing Sheets

U.S. PATENT DOCUMENTS

| | | | | |
|---|---|---|---|---|
| 6,154,664 A | * | 11/2000 | Chorey et al. | 455/571 |
| 6,169,449 B1 | * | 1/2001 | Hasegawa | 330/51 |
| 6,172,559 B1 | * | 1/2001 | Yamaguchi | 330/51 |
| 6,188,877 B1 | * | 2/2001 | Boesch et al. | 455/74 |
| 6,201,440 B1 | * | 3/2001 | Kobayashi | 330/51 |
| 6,208,202 B1 | * | 3/2001 | Kaufman et al. | 330/51 |
| 6,208,203 B1 | * | 3/2001 | Jung et al. | 330/51 |
| 6,229,995 B1 | * | 5/2001 | Lee | 455/127.2 |
| 6,240,279 B1 | * | 5/2001 | Nitta et al. | 455/127.2 |
| 6,265,935 B1 | * | 7/2001 | Kaneda et al. | 330/51 |
| 6,271,722 B1 | * | 8/2001 | Ballantyne | 330/51 |
| 6,298,244 B1 | * | 10/2001 | Boesch et al. | 455/553.1 |
| 6,313,698 B1 | * | 11/2001 | Zhang et al. | 330/51 |
| 6,369,649 B2 | * | 4/2002 | Nakajima | 330/51 |
| 6,400,933 B1 | * | 6/2002 | Mensink et al. | 455/179.1 |
| 6,532,357 B1 | * | 3/2003 | Ichikawa | 455/126 |
| 6,563,883 B1 | * | 5/2003 | Leinonen et al. | 375/295 |
| 6,603,359 B2 | * | 8/2003 | Fujiwara et al. | 330/310 |
| 6,668,028 B1 | * | 12/2003 | Wieck | 375/349 |
| 6,812,786 B2 | * | 11/2004 | Jackson et al. | 330/51 |

* cited by examiner

TRANSMITTER AND WIRELESS COMMUNICATION DEVICE HAVING A LOW POWER BYPASS BRANCH

BACKGROUND OF THE INVENTION

The invention relates to a transmitter and a wireless communication device, which comprises such a transmitter, particularly when a time division duplex TDD and a frequency division duplex FDD are used. Furthermore, the invention is particularly advantageous when the dynamic range of the transmitter's transmission power is wide.

In an FDD, signals are transmitted and received on different frequency bands, whereas in a TDD the same frequency band is used both for transmission and reception and the signals are separated from each other in time. FDD signals are thus typically transmitted continuously and TDD signals are discrete-time signals (bursts). In addition, an FDD transmitter can operate e.g. in compression mode where nothing is transmitted, i.e. transmission is not genuinely continuous. In third generation mobile communication systems, such as the UMTS (Universal Mobile Telecommunication System), both duplexing methods can be employed. For this reason, it is necessary to develop solutions which enable use of both duplexing methods in the same terminal. Seen from the terminal, in the UMTS the FDD transmission band has at the moment a range of 1920 to 1980 MHz and the FDD reception band a range of 2110 to 2170 MHz. Two frequency ranges are reserved for the TDD operation: TDD1 on a frequency band of 1900 to 1920 MHz and TDD1 on a frequency band of 2010 to 2025 MHz. In the future, other frequency bands will also be available for the FDD and TDD functions. In this document we concentrate on describing the structures in connection with the UMTS system, without excluding their applicability to any other system.

In the UMTS standardized transmission power levels vary between −50 and +24 dBm. This variation range of over 70 dB in the power level is needed to restrict interference levels and to eliminate the 'near-far' effect. Low transmission power levels are used for transmission of TDD signals, in particular, whereas the transmission power levels of FDD signals are typically higher because the TDD cells are typically micro/pico cells which have a smaller diameter than typical FDD cells, i.e. the maximum distance a TDD signal has to travel is usually shorter than the maximum range required of an FDD signal.

In prior art solutions wide dynamics has been achieved in transmission power control e.g. by first amplifying a signal by an adjustable amplifier and then by a power amplifier to achieve high transmission power levels. For low power levels, the amplification of the amplifier is turned down, but depending on the application, this does not typically reduce the power consumption of the amplifiers. Thus the switching capacity is poor at low power levels, i.e. the method wastes energy, which in turn uses up the power source energy faster. For a mobile user this means a shorter talktime, for example.

FIG. 1 illustrates a prior art transmitter circuit for FDD signals. A modulated signal TX is fed into an adjustable amplifier 1. A signal to be transmitted is obtained from the output of the adjustable amplifier 1 and it is filtered by a filter 2. In this case the filter 2 covers the FDD transmission band of the UMTS, i.e. its frequency band is in a range of 1920 to 1980 MHz. As stated above, this is at the moment a standardized frequency band and in the future it can be replaced by some other frequency band. Next the signal to be transmitted is amplified further by a power amplifier 3. A directional coupler 4 located after the power amplifier 3 takes a sample of transmission power for a detector 5, which generates a DC level comparable to the transmission power, the DC level being further used for controlling the transmission power control. In addition, in the UMTS the network is informed of the detected power level, i.e. the terminal reports the highest power levels it has used to the network (base station). The output of the power amplifier 3 is supplied to a duplex filter 7 via an isolator 6. The duplex filter is a three-port component which comprises separate filters 7a and 7b for the transmitting side and the receiving side and separates transmission and reception signals at different frequencies from each other. The filters 7a and 7b of the transmitting and receiving sides can be tuned to a desired frequency range. In other words, the transmitting side 7a of the duplex filter is tuned to a frequency range of 1920 to 1980 MHZ. The structure of the receiving side is not discussed here, neither is it described in the figure.

The antenna port 7c of the duplex filter is connected to an antenna coupler 8 for connecting the transmission branch 12 described above or a transmission branch 13 adapted to another mobile communication systems, such as the GSM (Global System for Mobile Communication) to an antenna 9. This structure does not imply how the TDD operation is implemented. TDD operation could be simply provided with a transmission branch of its own. To minimize the number of components, it would be advantageous to combine TDD and FDD signals into the same transmission branch in a terminal, particularly in the UMTS system where the TDD and FDD operations have been harmonized to correspond to each other to as large an extent as possible.

U.S. publications No. 5,152,004, Procedure for Forming Lower Power Levels in a Radio Telephone Transmitter, Väisänen et al., and U.S. Pat. No. 5,909,643, Transmitter power varying device having a bypass line for a power amplifier, Aihara, disclose solutions for generating low power levels by bypassing the power amplifier at low power levels. These solutions do not, however, provide a solution for transmitting signals of different types using the same signal path.

BRIEF DESCRIPTION OF THE INVENTION

The object of the invention is to provide a transmitter to alleviate the above-mentioned problems. The objects of the invention are achieved with a transmitter and a wireless communication device, which are characterized by what is disclosed in the independent claims. The preferred embodiments of the invention are described in the dependent claims.

The invention is preferably applicable to systems where both continuous-time and discrete-time signals are transmitted and where the dynamic range of transmission powers is wide. An example of such a system is the UMTS, which employs both continuous-time FDD signals and discrete-time TDD signals. To illustrate the invention, it is described in connection with the UMTS system in the following, without limiting the scope of the invention to this particular system.

The basic idea of the invention is to divide a common transmission branch adapted for both continuous-time and discrete-time signals into two parallel parts, i.e. a bypass branch and an amplification branch, so that a modulated signal is amplified by an adjustable amplifier, after which discrete-time signals to be transmitted at low transmission power levels below a pre-determined limit value are connected directly via the bypass branch to an antenna for transmission, and discrete-time signals requiring higher transmission power levels above the above-mentioned limit value and all continuous-time signals are connected to the antenna via the amplification branch.

At its simplest the amplification branch is a combination of a power amplifier and a filter and the bypass branch a direct signal path from the adjustable amplifier to the antenna. Bypass of the amplification branch can, however, be implemented by means of any suitable component or combination of components.

An advantage of the invention is that power consumption decreases at low transmission powers particularly when the transmission of continuous-time and that of discrete-time signals are combined into the same transmission branch. Furthermore, the circuit according to the invention is simple and can be implemented by a small number of components.

BRIEF DESCRIPTION OF THE DRAWINGS

The invention will be described in greater detail by means of preferred embodiments with reference to the accompanying drawings, in which.

DETAILED DESCRIPTION OF THE INVENTION

Figure 1:
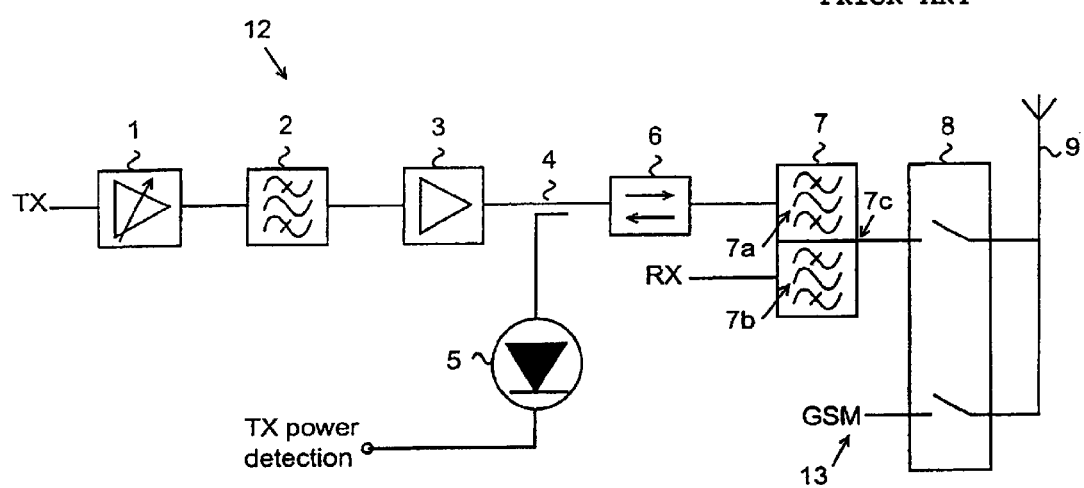
FIG. 1 illustrates a prior art circuit.
Figure 2:
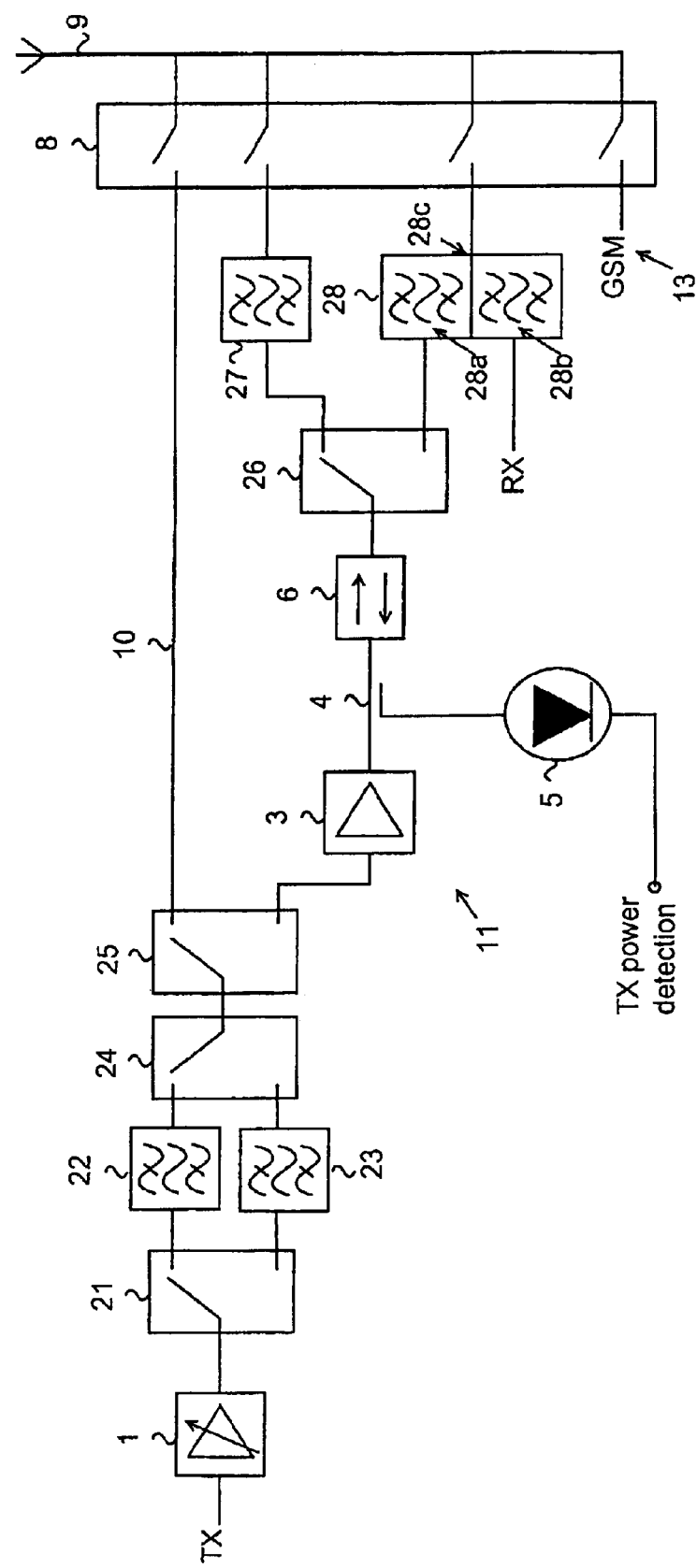
FIG. 2 illustrates a circuit according to an embodiment of the invention.

FIG. 2 illustrates a circuit according to an embodiment of the invention. A modulated signal TX is fed into an adjustable amplifier 1. The modulated signal can be either an FDD signal or a TDD signal. The output of the adjustable amplifier 1 is connected to one of two band-pass filters 22 or 23 by a coupler 21 by connecting the FDD signals (1920–1980 MHz) and the signals of the TDD1 band (1900–1920 MHz) to the filter 22 with a frequency band from 1900 to 1980 MHz and the signals of the TDD2 band to the filter 23 with a frequency band from 2010 to 2025 MHz.

After the above-mentioned filters 22 and 23 the transmission branch is divided into a bypass branch 10 and an amplification branch 11, to which the filter outputs are connected by couplers 24 and 25. If the signal to be transmitted is a discrete-time TDD signal requiring low transmission power below a predetermined limit value, it is connected to the bypass branch which bypasses the amplification branch and is operatively coupled to an antenna coupler 8, by means of which the signal to be transmitted is connected to an antenna 9 for transmission to the air interface.

The FDD signals and those TDD signals that require a transmission power higher than the above-mentioned limit value are connected to the amplification branch 11. The amplification branch 11 comprises a power amplifier 3, means 4 and 5 for detecting the transmission power level, an isolator 6, a coupler 26 and parallel filters 27 and 28, which all are arranged one after the other on the signal path. The power amplifier 3 amplifies the transmission power level further so that even higher transmission power levels can be achieved. The transmission power level is detected by taking a sample of the transmission power by a directional coupler 4 for a detector 5, which generates a DC level comparable to the transmission power. The detector 5 output is further used for controlling the transmission power control, i.e. amplification of the adjustable amplifier 1, and for informing the network of the power levels used by the terminal. The coupler 26 connects the signals of the TDD2 band to the filter 27 so that the frequency band to be transmitted can be filtered. Since the FDD transmission band and the TDD1 band are parallel in the frequency range, the FDD and TDD1 signals are connected to the transmitting side 28a of the duplex filter 28. In other words, the transmitting side 28a of the duplex filter is tuned to a frequency range of 1900 to 1980 MHz.

The filter 27 output and the antenna port 28c of the duplex filter 28 are connected to the same antenna coupler 8 as the bypass branch 10. Thus the antenna coupler 8 is used for connecting the bypass branch 10, the amplification branch 11 of the transmission branch or a transmission branch 13 adapted to another mobile communication system, such as the GSM (Global System for Mobile Communication), to the antenna 9.

The structure of the receiving side is not discussed here, nor is it illustrated in the figure.

Figure 3:
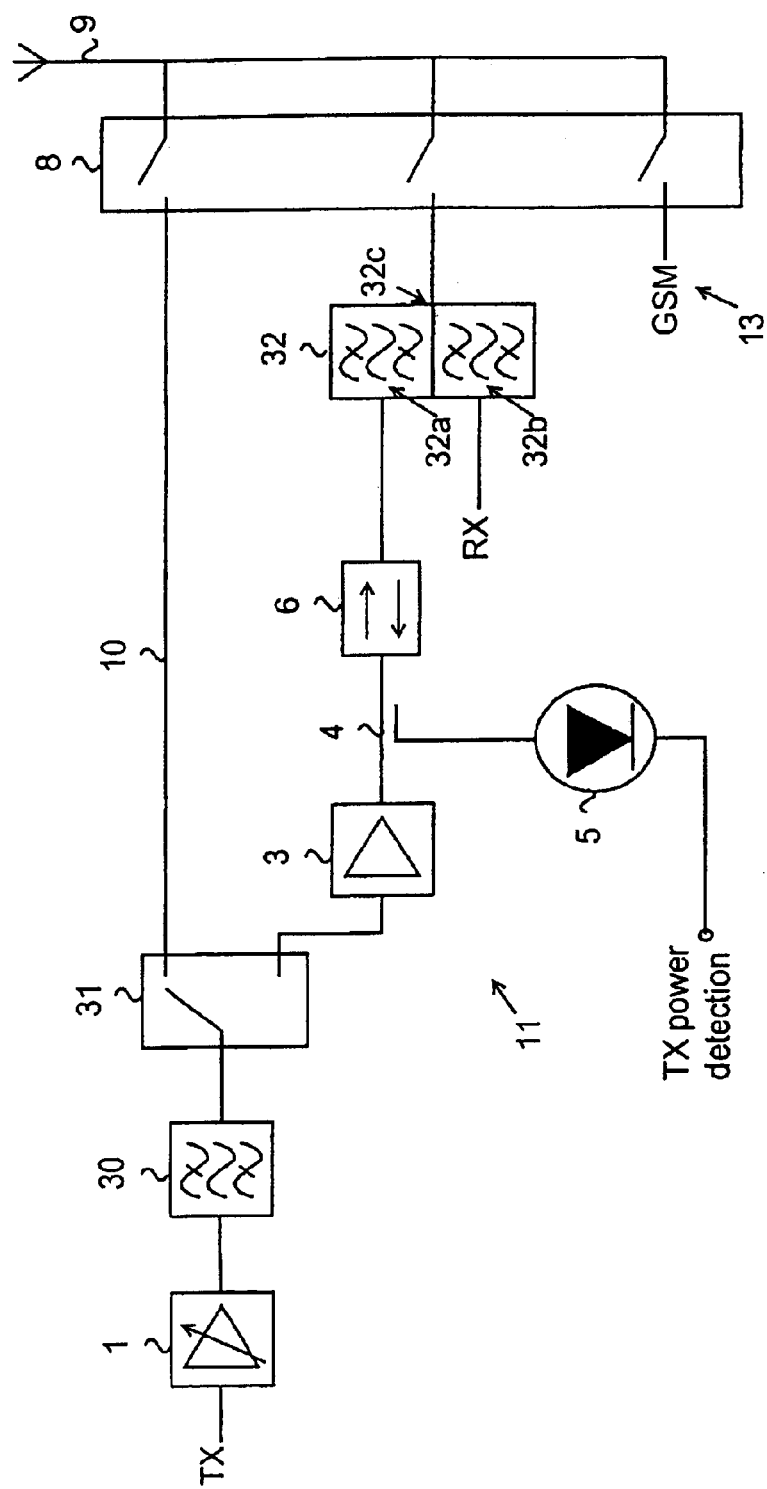
FIG. 3 illustrates a circuit according to another embodiment of the invention.

Depending on the real TDD operation, it may be unnecessary to provide solutions which support the upper TDD band, i.e. the TDD2 band (2010–2025 MHz). FIG. 3 shows a circuit according to another embodiment of the invention which supports only the TDD1 band. Compared to FIG. 2, this circuit is considerably simpler.

In this solution the output of the adjustable amplifier 1 is connected directly to a band-pass filter 30 with a frequency band of 1900 to 1980 MHz, which thus covers the FDD transmission band and the TDD1 band. After the filter 30, the transmission branch is divided into a bypass branch 10 and an amplification branch 11 as in FIG. 2. The branch to be used is selected by a coupler 31. If the signal is a discrete-time TDD signal to be transmitted at a transmission power below a predetermined limit value, it is connected to the bypass branch, which is identical to that shown in FIG. 2.

FDD signals and those TDD signals that require transmission powers higher than the above-mentioned limit value are connected to the amplification branch 11. The amplification branch 11 comprises a power amplifier 3, means 4 and 5 for detecting the transmission power level and an isolator 6, like the circuit shown in FIG. 2. The isolator 6 output is supplied to the transmitting side 32a of the duplex filter 32, i.e. the transmission band of all signals in the amplification branch is filtered by the duplex filter 32. The antenna port 32c of the duplex filter 32 is connected to the same antenna coupler 8 as the bypass branch 10. The antenna coupler 8 thus connects the bypass branch 10, the amplification branch 11 of the transmission branch or a transmission branch 13 adapted to another mobile communication system, such as the GSM (Global System for Mobile Communication), to the antenna 9.

In the circuits described by examples the bypass branch was presented as a direct signal path from the coupler 25 or 31 to the antenna coupler. These are, however, only examples, and bypass of the amplification branch, which at its simplest is a combination of a power amplifier and a filter, can be implemented via any suitable component or combination of components.

It is obvious to a person skilled in the art that, as the technology advances, the inventive concept can be implemented in various ways. The above description concentrated mainly on the transmitting part; however, this transmitting part can also be included in any transmitter/receiver or in any device comprising a transmitter. The invention and its embodiments are thus not limited to the above examples, but they may vary within the scope of the claims.

What is claimed is:

1. A transmitter into which a modulated signal is fed, the transmitter comprising
   an adjustable amplifier for adjusting transmission power level, the modulated signal being fed into to the input of the amplifier,
   an amplification branch arranged after the adjustable amplifier on the signal path, the amplification branch comprising
   a power amplifier for further amplifying the transmission power level, and
   at least one filter arranged after the power amplifier on the signal path for filtering the frequency band to be transmitted,
   an antenna after the amplification branch on the signal path for transmitting signals, and
   a bypass branch which operatively couples the output of the adjustable amplifier and the antenna and is used for bypassing the amplification branch and connecting signals to be transmitted at low transmission power levels directly to the antenna.

2. A transmitter according to claim 1, wherein the transmitter is adapted both for continuous-time and for discrete-time signals so that continuous-time signals are fed into the amplification branch, discrete-time signals to be transmitted at low transmission power levels are fed into the bypass branch and discrete-time signals to be transmitted at high transmission power levels are fed into the amplification branch.

3. A transmitter according to claim 1, wherein low transmission power levels are levels lower than a pre-determined limit value and high transmission power levels are levels higher than a pre-determined limit value.

4. A transmitter according to claim 2, wherein the continuous-time signals are frequency division duplex, FDD, signals and the discrete-time signals are time division duplex, TDD, signals.

5. A transmitter according to claim 1, wherein at least one filter is arranged on the signal path after the adjustable amplifier, at least one switch being operatively coupled to the filter output for selecting the bypass branch or the amplification branch.

6. A wireless communication device comprising a transmitter into which a modulated signal is fed, the transmitter comprising
   an adjustable amplifier for adjusting the transmission power level, the modulated signal being fed into the output of the amplifier,
   an amplification branch arranged after the adjustable amplifier on the signal path, the amplification branch comprising
   a power amplifier for further amplifying the transmission power level, and
   at least one filter arranged after the power amplifier on the signal path for filtering the frequency band to be transmitted,
   an antenna arranged after the amplification branch on the signal path for transmitting signals, and
   a bypass branch which operatively couples the output of the adjustable amplifier and the antenna and is used for bypassing the amplification branch and connecting signals to be transmitted at low transmission power levels directly to the antenna.

* * * * *